(12) United States Patent
Kubota et al.

(10) Patent No.: US 8,092,980 B2
(45) Date of Patent: Jan. 10, 2012

(54) PHOTOSENSITIVE ELEMENT

(75) Inventors: Masao Kubota, Ibaraki (JP); Shinji Takano, Ibaraki (JP); Eiichirou Yamada, Ibaraki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 21 days.

(21) Appl. No.: 12/525,443

(22) PCT Filed: Jan. 28, 2008

(86) PCT No.: PCT/JP2008/051219
§ 371 (c)(1),
(2), (4) Date: Jul. 31, 2009

(87) PCT Pub. No.: WO2008/093643
PCT Pub. Date: Aug. 7, 2008

(65) Prior Publication Data
US 2010/0112481 A1    May 6, 2010

(30) Foreign Application Priority Data
Jan. 31, 2007    (JP) .................................. 2007-021014

(51) Int. Cl.
*G03F 7/09* (2006.01)

(52) U.S. Cl. .................................................. 430/271.1

(58) Field of Classification Search .................. None
See application file for complete search history.

(56) References Cited

U.S. PATENT DOCUMENTS

| | | | | |
|---|---|---|---|---|
| 3,884,693 A | * | 5/1975 | Bauer et al. ................. | 430/263 |
| 4,318,975 A | * | 3/1982 | Kuznetsov et al. ........... | 430/160 |
| 5,648,159 A | | 7/1997 | Sato | |
| 5,922,509 A | | 7/1999 | Kautz et al. | |

FOREIGN PATENT DOCUMENTS

| | | |
|---|---|---|
| JP | 47-469 A | 1/1972 |
| JP | 55-501072 A | 12/1980 |
| JP | 56-40824 B2 | 9/1981 |
| JP | 59-97138 A | 6/1984 |
| JP | 59-216141 A | 12/1984 |
| JP | 61-31855 A | 2/1986 |
| JP | 62-139547 A | 6/1987 |
| JP | 63-74052 A | 4/1988 |
| JP | 63-197942 A | 8/1988 |
| JP | 1-221735 A | 9/1989 |
| JP | 2-230149 A | 9/1990 |
| JP | 7-333853 A | 12/1995 |
| JP | 11-237132 A | 8/1999 |
| JP | 11-327132 A | 11/1999 |
| JP | 11-327137 A | 11/1999 |
| JP | 2001-117237 A | 4/2001 |
| JP | 3452597 B2 | 7/2003 |
| JP | 2004-317851 A | 11/2004 |
| JP | 2004-347756 A | 12/2004 |
| JP | 2004-361446 A | 12/2004 |
| JP | 2005-274792 A | 10/2005 |
| JP | 2005-331695 A | 12/2005 |
| JP | 2006-3435 A | 1/2006 |
| JP | 2006-39193 A | 2/2006 |
| JP | 2006-154622 A | 6/2006 |
| JP | 2006-220858 A | 8/2006 |
| JP | 2006-267463 A | 10/2006 |
| JP | 2006-327158 A | 12/2006 |
| JP | 2007-114731 A | 5/2007 |
| JP | 2007-304541 A | 11/2007 |
| WO | 80/01321 A | 6/1980 |
| WO | 00/79344 A | 12/2000 |

OTHER PUBLICATIONS

English translation of JP, 2006-003435, A (2006) from machine translation from AIPN Japan Patent Office National Center for Industrial Property Information and Training, generated Dec. 7, 2010, 104 pages.*
English translation of JP 2006-154622, , A (2006) from machine translation from AIPN Japan Patent Office National Center for Industrial Property Information and Training, generated Dec. 7, 2010, 106 pages.*
English translation of JP, 11-327132, A (1999) from machine translation from AIPN Japan Patent Office National Center for Industrial Property Information and Training, generated Dec. 7, 2010, 11 pages.*
English translation of JP, 2004-361446, A (2004) from machine translation from AIPN Japan Patent Office National Center for Industrial Property Information and Training, generated Dec. 7, 2010, 24 pages.*
English translation of JP, 2004-347756, A (2004) from machine translation from AIPN Japan Patent Office National Center for Industrial Property Information and Training, generated Dec. 7, 2010, 14 pages.*
English translation of JP, 2001-117237, A (2001) from machine translation from AIPN Japan Patent Office National Center for Industrial Property Information and Training, generated Dec. 7, 2010, 9 pages.*
International Search Report issued in corresponding application No. PCT/JP2008/051219, completed Feb. 7, 2008 and mailed Feb. 19, 2008.
English translation of the IPRP Written Opinion of the International Searching Authority, issued Aug. 4, 2009.
esp@cenet English Abstract for the JP'435 Document, which is filed herewith as "Exhibit A", English abstract of JP2006003435a published Jan. 2006.
esp@cenet English Abstract for the JP'622 Document, which is filed herewith as "Exhibit B", English abstract of JP 2006154622a published Jun. 2006.

(Continued)

*Primary Examiner* — Cynthia Hamilton
(74) *Attorney, Agent, or Firm* — Griffin & Szipl, P.C.

(57) ABSTRACT

A photosensitive element 1 comprising a support film 10 and a layer (photosensitive layer) 20 composed of a photosensitive resin composition formed on the support film 10, wherein the haze of the support film 10 is 0.01-2.0%, the total number of particles and aggregates with diameters of 5 μm or larger in the support film 10 is no greater than 5/mm$^2$, the photosensitive layer 20 contains (A) a binder polymer, (B) a photopolymerizing compound with an ethylenic unsaturated bond and (C) a photopolymerization initiator, and the thickness of the photosensitive layer 20 is 3-30 μm.

2 Claims, 3 Drawing Sheets

OTHER PUBLICATIONS esp@cenet English Abstract for the JP'132 Document, which is filed herewith as "Exhibit C", English abstract of JP 11327132 a published Nov. 1999.

esp@cenet English Abstract for the JP'446 Document, which is filed herewith as "Exhibit D", English abstract of Jp 2004361446 a published Dec. 2004.

esp@cenet English Abstract for the JP'756 Document, which is filed herewith as "Exhibit E", English abstract of JP2004347756a published Dec. 2004.

esp@cenet English Abstract for the JP'237 Document, which is filed herewith as "Exhibit F", Englsih abstract of JP 200117237a published Apr. 2001.

* cited by examiner

PHOTOSENSITIVE ELEMENT

This is a National Phase Application in the United States of International Patent Application No. PCT/JP2008/051219 filed Jan. 28, 2008, which claims priority on Japanese Patent Application No. P2007-021014, filed Jan. 31, 2007. The entire disclosures of the above patent applications are hereby incorporated by reference.

TECHNICAL FIELD

The present invention relates to a photosensitive element.

BACKGROUND ART

The fields of manufacturing conventional printed wiring boards and precision working of metals widely employ photosensitive elements, that comprise a layer made of a photosensitive resin composition (hereinafter referred to as "photosensitive layer"), a support film and a protective film, as resist materials for etching, plating and the like.

A printed wiring board may be manufactured, for example, in the following manner. First, the protective film of a photosensitive element is released from the photosensitive layer and the photosensitive layer is then laminated on the conductive film of a circuit-forming board. After subsequent pattern exposure of the photosensitive layer, the unexposed sections are removed with a developing solution to form a resist pattern. The conductive film is patterned based on this resist pattern to form the printed wiring board.

The developing solution used for removal of the unexposed sections is usually an alkali developing solution such as a sodium hydrogencarbonate solution. For most purposes, the developing solution may be any one capable of dissolving the photosensitive layer to some extent, as the photosensitive layer becomes dissolved in the developing solution or dispersed in the developing solution during development.

With increasingly higher densities of printed wiring boards in recent years, the contact areas between circuit-forming boards and the photosensitive layers that are used as resist materials have been decreasing in size. The photosensitive layer must therefore have excellent mechanical strength, chemical resistance and flexibility in the etching or plating step, while also having excellent adhesiveness for circuit-forming boards and high resolution for pattern formation.

When a photosensitive element is used to form a resist, usually the photosensitive layer is laminated on the board and exposed without peeling off the support film. An optically transparent material may be employed as the support film to facilitate exposure treatment. The support film must also be as thin as possible in order to obtain high resolution for pattern formation. On the other hand, a certain minimum level of thickness (generally 10 μm-30 μm) is required for the support film in order to allow coating of the photosensitive resin composition on the support film to a uniform thickness with satisfactory yield. For increased productivity of the support film, i.e. to improve the take-up properties of the support film, inorganic or organic fine particles are usually added to the support film. Conventional support films therefore have increased haze, and the fine particles in the support film tend to cause light scattering under light exposure, so that the requirement for high resolution of the photosensitive film cannot be met.

Methods for achieving high resolution include a method wherein a support film provided on a photosensitive element is peeled off before exposure so that exposure is accomplished without the support film. In this case, a phototool is often bonded directly onto the photosensitive layer. However, since the photosensitive layer usually has some level of pressure-sensitive adhesive property, it is difficult to remove the bonded phototool when exposure is carried out after directly bonding a phototool onto the photosensitive layer. In addition, the photosensitivity tends to be reduced by contamination of the phototool by the photosensitive layer, or exposure of the photosensitive layer to oxygen in the air when the support film is removed.

Various means have been proposed as improvements in this regard. For example, Patent documents 1-3 disclose methods in which two or more photosensitive layers are formed, the layer directly bonded to the phototool being one without an adhesive property. Also, Patent documents 4-9 propose methods in which an interlayer is provided between the support film and photosensitive layer. In Patent documents 10 and 11 there are proposed methods in which inorganic or organic fine particles are added to the outer surface on one side of the support film to lower the haze, thus allowing high resolution even with exposure through the support film.

[Patent document 1] Japanese Patent Application Laid-Open No. 61-031855
[Patent document 2] Japanese Patent Application Laid-Open No. 01-221735
[Patent document 3] Japanese Patent Application Laid-Open No. 02-230149
[Patent document 4] Japanese Examined Patent Publication No. 56-040824
[Patent document 5] Japanese Patent Application Laid-Open No. 55-501072
[Patent document 6] Japanese Patent Application Laid-Open No. 47-000469
[Patent document 7] Japanese Patent Application Laid-Open No. 59-097138
[Patent document 8] Japanese Patent Application Laid-Open No. 59-216141
[Patent document 9] Japanese Patent Application Laid-Open No. 63-197942
[Patent document 10] Japanese Patent Application Laid-Open No. 07-333853
[Patent document 11] WO00/079344

DISCLOSURE OF THE INVENTION

Problems to be Solved by the Invention

The methods described in Patent documents 1-9, however, require extra coating steps for formation of the interlayer or formation of multiple photosensitive layers, and this increases the number of manufacturing steps. Also, since the photosensitive layer is exposed to oxygen in the air when it is set on the substrate, it is difficult to maintain high photosensitivity by the means described in Patent documents 1-3. Furthermore, since the interlayer is thin with the means described in Patent documents 4-9, the photosensitive element is not easy to handle.

Results of investigation by the present inventors have also revealed that, despite the increased high resolution when using the means described in Patent documents 10 and 11, microdefects are formed in the resist pattern and the production yield for high-density printed wiring boards tends to be reduced.

The present invention has been accomplished in light of these circumstances, and its object is to provide a photosensitive element comprising a thin-film layer composed of a photosensitive resin composition, whereby it is possible to form resist patterns with satisfactorily reduced microdefects in the resist.

Means for Solving the Problems

The invention therefore provides a photosensitive element comprising a support film and a layer composed of a photosensitive resin composition formed on the support film, wherein the haze of support film is 0.01-2.0%, the total number of particles with diameters of 5 μm or larger and aggregates with diameters of 5 μm or larger in the support film is no greater than 5/mm², the layer composed of the photosensitive resin composition contains (A) a binder polymer, (B) a photopolymerizing compound with an ethylenic unsaturated bond and (C) a photopolymerization initiator, and the thickness of the layer composed of the photosensitive resin composition is 3-30 μm.

The present inventors have investigated in detail the causes due to which microdefects are formed in resist patterns. First, it was assumed that one of the components in the photosensitive layer, i.e. the binder polymer, the photopolymerizing compound with an ethylenic unsaturated bond and the photopolymerization initiator, is a factor, and the effects of the different components in the photosensitive layer were examined; however, it was not possible to overcome the problem of microdefects in the resist pattern. We then examined the protective film, but still could not overcome the problem of microdefects in the resist pattern.

The present inventors then carefully investigated the support film. In Patent documents 10 and 11 mentioned above, there are described two-layer support films containing inorganic or organic fine particles with mean particle sizes of about 0.01-5 μm, and having haze values of 0.01-2.0%. However, the present inventors determined that, in actuality, many particles with diameters of 5 μm or larger and less than 20 μm are present in the support films (at least 20/mm², according to investigation by the present inventors). Moreover, it was found that such support films have microdefects formed in the resist pattern after development because light scattering of active light rays irradiated during light exposure makes it difficult for the active light rays to reach the photosensitive layer, due to the presence of particles and aggregates with diameters of 5 μm or larger. It was therefore considered that the aforementioned object can be achieved by employing as the support film a film that has not only a sufficiently reduced haze of 0.01-2.0%, but also a sufficiently low total number of particles with diameters of 5 μm or larger and aggregates with diameters of 5 μm or larger, of no more than 5/mm² within the film, and the invention was thereupon completed.

The weight-average molecular weight of the (A) binder polymer in the layer composed of a photosensitive resin composition in the photosensitive element of the invention is preferably 30000-150000. This will facilitate formation of a thin-film layer composed of the photosensitive resin composition, so that a resist pattern with even fewer microdefects in the resist can be formed.

Effect of the Invention

According to the invention it is possible to provide a photosensitive element comprising a thin-film layer composed of a photosensitive resin composition, whereby resist patterns with satisfactorily reduced microdefects in the resist can be formed.

EXPLANATION OF SYMBOLS

1: Photosensitive element, 10: support film, 12: first main side, 14: second main side, 20: photosensitive layer.

BEST MODES FOR CARRYING OUT THE INVENTION

Preferred embodiments of the invention will now be explained in detail, with reference to the accompanying drawings as necessary. Throughout the drawings, corresponding elements will be referred to by like reference numerals and will be explained only once. Unless otherwise specified, the vertical and horizontal positional relationships are based on the positional relationships in the drawings. Also, the dimensional proportions depicted in the drawings are not necessarily limitative. The term "(meth)acrylate" used throughout the present specification refers to the "acrylate" and its corresponding "methacrylate". Similarly, the term "(meth)acrylic" refers to the "acrylic" and its corresponding "methacrylic" compound, and "(meth)acryloyl" refers to the "acryloyl" and its corresponding "methacryloyl" compound.

Figure 1:
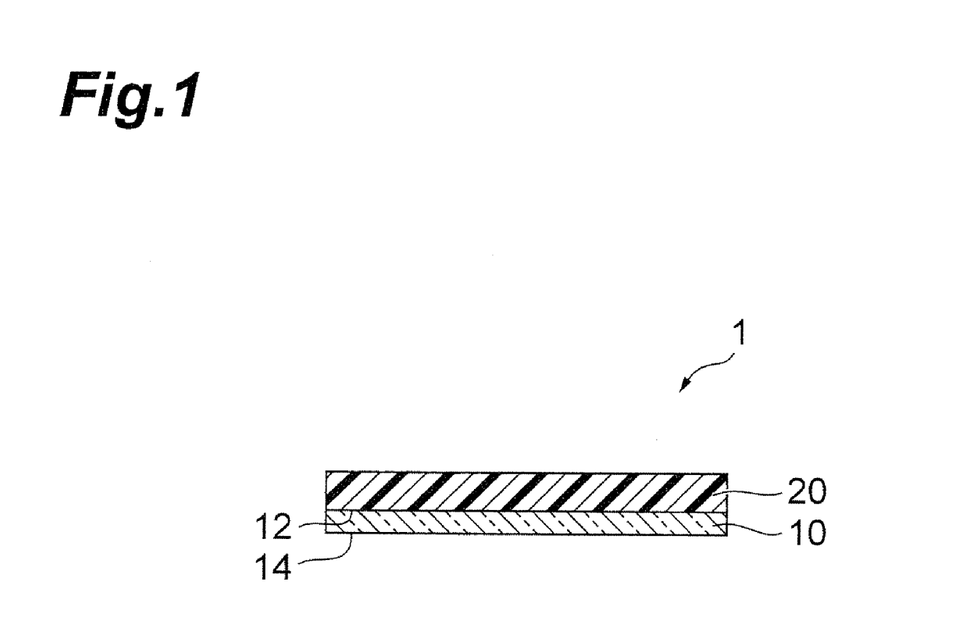
FIG. 1 is a schematic cross-sectional view showing a preferred embodiment of a photosensitive element of the invention.

FIG. 1 is a schematic cross-sectional view showing a preferred embodiment of a photosensitive element of the invention. The photosensitive element 1 shown in FIG. 1 has a construction with a support film 10 and a photosensitive layer 20. The photosensitive layer 20 is formed on the first main side 12 of the support film 10. The support film 10 has a second main side 14 opposite the first main side 12.

(Support Film)

The support film 10 has a haze of 0.01-2.0%, and a total number of particles and aggregates with diameters of 5 μm or larger in the support film 10 (hereinafter collectively referred to simply as "particles") of no greater than 5/mm². The particles with diameters of 5 μm or larger in the support film 10 include particles that protrude from the main side of the support film, and particles present within the film. The particles with diameters of 5 μm or larger also include primary particles with diameters of 5 μm or larger and aggregates of primary particles with diameters of less than 5 μm.

The number of such particles with diameters of 5 μm or larger is preferably no greater than 5/mm², more preferably no greater than 3/mm² and even more preferably no greater than 1/mm². If the number of particles exceeds 5/mm², partial loss of the resist (microdefects in the resist) will tend to occur after light exposure and development. When such a photosensitive element is used in a printed wiring board, it can be a cause of open failures with etching or shorting failures with plating, thus lowering the production yield of the printed wiring board.

However, even a large number of particles with diameters of less than 5 μm in the support film 10 will not significantly affect the light scattering. The reason for this is that upon irradiation of light on the photosensitive layer in the exposure step, the photocuring reaction in the photosensitive layer proceeds not only at the photoirradiated sections but also to some degree in the transverse direction (the direction perpendicular to the photoirradiation direction) where the light has not been directly irradiated. With small particle sizes, therefore, photocuring reaction proceeds satisfactorily directly below the particles, but as the particle sizes increase the photocuring reaction fails to satisfactorily occur directly below the particles, thus resulting in microdefects in the resist.

The particles with diameters of 5 μm or larger in the support film 10 are produced as aggregates of the constituent components of the support film, such as the gelled polymers, the monomer starting materials, the catalyst used for production and the inorganic or organic fine particles included as necessary, which aggregates form during fabrication of the film, as well as bulges of the lubricant and adhesive that occur during coating of the lubricant-containing layer on the film, and particles with diameters of 5 μm or larger that are present in the film. Particles with small particle sizes or high dispersibility may be selectively used among such particles, in order to limit the number of particles with diameters of 5 μm or larger to no more than 5/mm$^2$.

Figure 2:
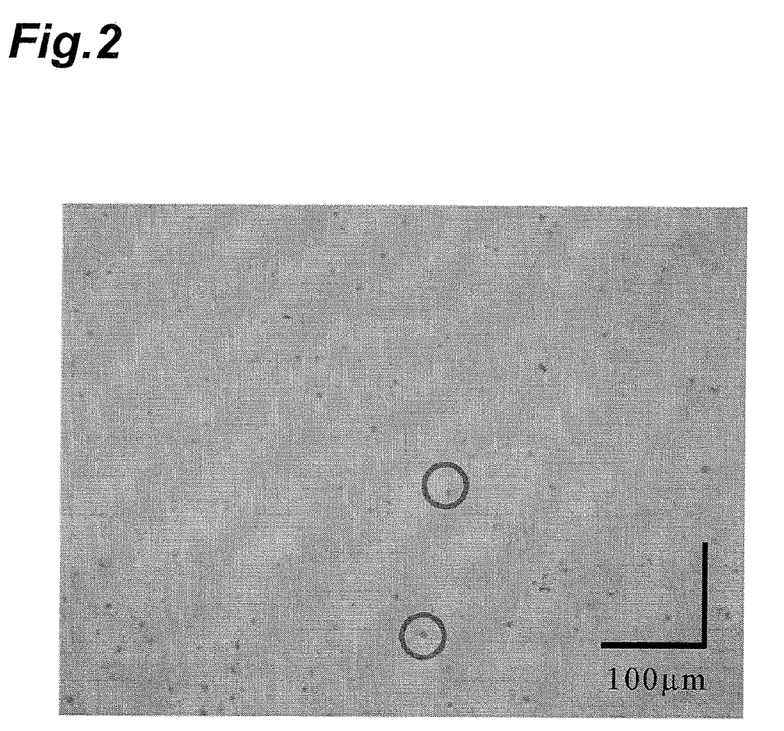
FIG. 2 is a polarizing microscope photograph of the surface of a support film containing particles with diameters of 5 μm or larger.
Figure 3:
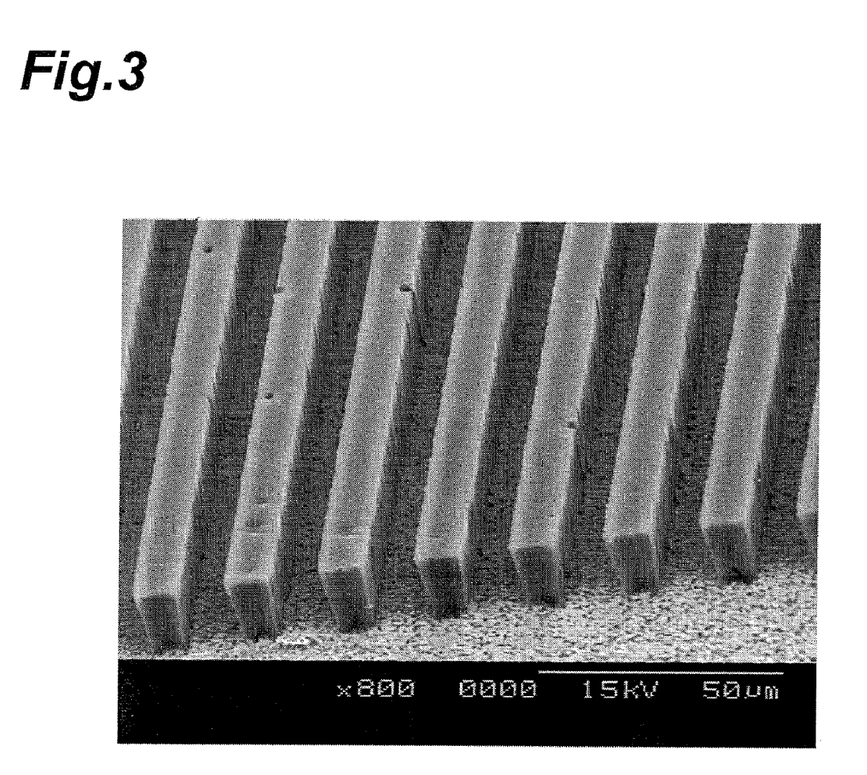
FIG. 3 is a scanning photomicrograph of a resist pattern formed using a photosensitive element comprising a photosensitive layer on a support film with numerous particles with diameters of 5 μm or larger.

The number of particles with diameters of 5 μm or larger may be measured using a polarizing microscope. An aggregate formed by aggregation of a primary particle with a diameter of 5 μm or larger and a primary particle with a diameter of less than 5 μm is counted as one. FIG. 2 is a polarizing microscope photograph of the surface of a support film containing particles with diameters of 5 μm or larger. In FIG. 2, the circled regions are examples of sections corresponding to particles with diameters of 5 μm or larger. FIG. 3 is a scanning photomicrograph of a resist pattern formed using a photosensitive element comprising a photosensitive layer on a support film with numerous particles with diameters of 5 μm or larger. When numerous particles with diameters of 5 μm or larger are present on the surface of the support film as shown here, microdefects are produced in the resist.

The material of the support film 10 is not particularly restricted so long as the total number of particles and aggregates with diameters of 5 μm or larger is no greater than 5/mm$^2$. The support film 10 may be, for example, a film containing one or more resin materials selected from the group consisting of polyesters such as polyethylene terephthalate (hereinafter abbreviated as "PET") and polyolefins such as polypropylene and polyethylene.

The support film 10 may be either a monolayer or a multilayer film. For example, when a two-layer support film comprising 2 layers is to be used, preferably a two-layer film obtained by laminating a fine particle-containing resin layer on one side of a biaxially oriented polyester film may be used as the support film, and a photosensitive layer is formed on the side opposite the side on which the fine particle-containing resin layer has been formed. The support film may also be a multilayer support film composed of three layers (A layer/B layer/A layer, for example). There are no particular restrictions on the construction of the multilayer support film, but from the viewpoint of slidability of the film the outermost layer (the A layer in the case of the aforementioned three-layer film) is preferably a fine particle-containing resin layer.

Because conventional two-layer support films are produced by coating a biaxially oriented polyester film with a fine particle-containing resin layer, the fine particle-containing resin layer tends to peel during lamination of the photosensitive film, and the peeled resin layer can attach to the photosensitive resin layer and cause defects. According to the invention, therefore, the fine particle-containing resin layer is preferably a multilayer support film comprising three layers formed by injection molding on both sides of a biaxially oriented polyester film.

Preferably, according to the invention, the number of particles with diameters of 5 μm or larger in the support film is adjusted to no more than 5/mm$^2$, while the multilayer support film is also provided with such a fine particle-containing resin layer. This will improve the slidability of the film and create a satisfactory balance and higher level property for inhibiting light scattering during light exposure. The mean particle size of the fine particles is preferably 0.1-10 times and more preferably 0.2-5 times the layer thickness of the fine particle-containing resin layer. A mean particle size of less than 0.1 times the thickness will tend to result in poor slidability, while an excess of 10 times the thickness will tend to create irregularities in the photosensitive layer.

The fine particles are preferably present at 0.01-50 wt % in the fine particle-containing resin layer. As examples for the fine particles, there may be used fine particles and aggregates produced during polymerization by various nucleating agents, inorganic fine particles such as silicon dioxide fine particles (aggregated silica and the like), calcium carbonate fine particles, alumina fine particles, titanium oxide fine particles and barium sulfate fine particles, organic fine particles such as crosslinked polystyrene fine particles, acrylic fine particles, imide fine particles and the like, as well as mixtures of the foregoing.

In a multilayer support film with three or more layers, one or more interlayers sandwiched between fine particle-containing outermost layers may contain or may not contain fine particles, but they preferably do not contain the fine particles from the standpoint of resolution. When an interlayer contains the aforementioned fine particles, the content in the interlayer is preferably no greater than ⅓ and more preferably no greater than ⅕ of the content in the outermost layer.

From the standpoint of resolution, the layer thickness of the fine particle-containing resin layer is preferably 0.01-5 μm, more preferably 0.05-3 μm and most preferably 0.1-2 μm. The side of the outermost layer not facing the interlayer preferably has a static friction coefficient of no greater than 1.2. A static friction coefficient of greater than 1.2 will lead to wrinkles during film formation and photosensitive element fabrication, and the increased static electricity will tend to cause adhesion of dirt. For the purpose of the invention, the static friction coefficient can be measured according to ASTM D1894.

In order to limit the number of particles with diameters of 5 μm or larger in the support film 10 to no more than 5/mm$^2$, it is preferred for the particle sizes of the fine particles in the fine particle-containing resin layer to be less than 5 μm. Also, in order to further reduce light scattering during exposure, it is preferred to appropriately adjust the layer thickness of the fine particle-containing resin layer according to the particle sizes of the fine particles.

The support film 10 may also contain an antistatic agent or the like if necessary, within a range that does not impair the photosensitive property.

The haze of the support film 10 is preferably 0.01-2.0%, more preferably 0.01-1.5% and even more preferably 0.01-1.0% and especially preferably 0.01-0.5%. If the haze is less than 0.01% the support film itself will not be easy to fabricate, and if it is greater than 2.0% the sensitivity and resolution will tend to be reduced. The term "haze" refers to the degree of cloudiness. The haze according to the invention is the value measured using a commercially available cloudiness meter (turbidimeter) according to the method of JIS K 7105. The haze may be using a commercially available turbidimeter such as an NDH-1001DP (trade name of Nippon Denshoku Industries Co., Ltd.).

The thickness of the support film 10 is preferably 5-40 µm, more preferably 8-35 µm, even more preferably 10-30 µm and most preferably 12-25 µm. If the thickness is less than 5 µm, the support film 10 will tend to tear when it is released from the photosensitive element 1. If the thickness exceeds 40 µm, the resolution will tend to be reduced and economy may be compromised.

The support film 10 may be procured from among ordinary commercially available industrial films that are suitable for use as support films for the photosensitive element 1 with appropriate processing. An example of an ordinary industrial film suitable for use as the support film 10 is "QS-48" (trade name of Toray Co., Ltd.), a PET film with a three-layer structure containing fine particles in the outermost layer.

(Photosensitive Layer)

The photosensitive layer 20 is a layer comprising a photosensitive resin composition. The photosensitive resin composition in the photosensitive layer 20 comprises (A) a binder polymer, (B) a photopolymerizing compound with an ethylenic unsaturated bond and (C) a photopolymerization initiator. Each of the components will now be explained in detail.

The binder polymer for component (A) is not particularly restricted so long as it is one used in conventional photosensitive resin compositions, and as examples there may be mentioned acrylic resins, styrene resins, epoxy resins, amide resins, amide-epoxy resins, alkyd resins and phenol resins. Acrylic resins are preferred from the viewpoint of the alkali developing property. These may be used as single compounds or as combinations of two or more compounds.

The binder polymer may be produced by radical polymerization of a polymerizable monomer. As polymerizable monomers there may be mentioned styrene, polymerizable styrene derivatives such as vinyltoluene, α-methylstyrene, p-methylstyrene and p-ethylstyrene, acrylamides, acrylonitrile, vinyl alcohol esters such as vinyl-n-butyl ether, alkyl (meth)acrylate esters, benzyl (meth)acrylate esters, tetrahydrofurfuryl (meth)acrylate esters, dimethylaminoethyl (meth)acrylate esters, diethylaminoethyl (meth)acrylate esters, glycidyl (meth)acrylate esters, 2,2,2-trifluoroethyl (meth)acrylate, 2,2,3,3-tetrafluoropropyl (meth)acrylate, (meth)acrylic acid, α-bromo(meth)acrylic acid, α-chlor (meth)acrylic acid, β-furyl(meth)acrylic acid, β-styryl(meth) acrylic acid, maleic acid monoesters such as maleic acid anhydride, monomethyl malate, monoethyl malate and monoisopropyl malate, and fumaric acid, cinnamic acid, α-cyanocinnamic acid, itaconic acid, crotonic acid and propiolic acid.

As alkyl (meth)acrylate esters there may be mentioned those wherein the alkyl group at the ester position is a C1-12 alkyl group. As examples of such alkyl (meth)acrylate esters there may be mentioned methyl (meth)acrylate, ethyl (meth) acrylate, propyl (meth)acrylate, butyl (meth)acrylate, pentyl (meth)acrylate, hexyl (meth)acrylate, heptyl (meth)acrylate, octyl (meth)acrylate, 2-ethylhexyl (meth)acrylate, and structural isomers of the foregoing. The alkyl groups may also be optionally substituted with hydroxyl, epoxy, halogens or the like.

The binder polymer is preferably one containing a carboxyl group in the molecule, from the viewpoint of the alkali developing property. The binder polymer with a carboxyl group may be produced by radical polymerization of a carboxyl group-containing polymerizable monomer and another polymerizable monomer. Methacrylic acid is preferred as a carboxyl group-containing polymerizable monomer. Of these, binder polymers with alkyl (meth)acrylate esters and (meth)acrylic acid as monomer units are preferred.

The binder polymer preferably contains styrene or a styrene derivative as the monomer unit from the viewpoint of adhesiveness and chemical resistance (plating resistance). When styrene or a styrene derivative is used as a copolymerizing component, the binder polymer preferably contains it at 3-30 wt %, more preferably 4-28 wt % and especially 5-27 wt %, in order to achieve satisfactory adhesiveness and release properties. If the content is less than 3 wt % the adhesiveness will tend to be reduced, and if it is greater than 30 wt % the release strip will be larger, tending to lengthen the release time.

The binder polymer has a weight-average molecular weight of preferably 30000-150000 and more preferably 40000-120000. When the photosensitive element of the invention is to be used in etching, where a small film thickness is preferred for the photosensitive layer, the weight-average molecular weight of the binder polymer is most preferably 80000-100000, from the viewpoint of improving the film strength (tenting property). In the case of plating, where a large film thickness is preferred for the photosensitive layer, the weight-average molecular weight of the binder polymer is most preferably 40000-60000, from the viewpoint of improving the release property of the photosensitive layer. If the weight-average molecular weight is less than 30000 the photosensitive layer will tend to be brittle, while if it is greater than 150000, strand-like development residues will tend to be generated, thus lowering the resolution. The weight-average molecular weight is that measured by gel permeation chromatography (hereinafter abbreviated as "GPC") and calculated using in terms of standard polystyrene.

The acid value of the binder polymer is preferably 30-300 mgKOH/g and more preferably 100-200 mgKOH/g. If the acid value is less than 30 mgKOH/g the developing time will tend to be longer, and if it is greater than 300 mgKOH/g the acidity with respect to the alkali developing solution of the photocured resist will tend to be lower.

Such binder polymers may be used alone or in combinations of two or more. As examples of binder polymer combinations when two or more are used in combination, there may be mentioned two or more binder polymers composed of different copolymerizing components, two or more binder polymers with different weight-average molecular weights, and two or more binder polymers with different dispersibilities. There may also be used a polymer having a multimode molecular weight distribution, as described in Japanese Patent Application Laid-open No. 11-327137.

When development with an organic solvent is carried out as the developing step, it is preferred to adjust the carboxyl group-containing polymerizable monomer to a smaller amount. If necessary, the binder polymer may have a photosensitive group.

The photopolymerizing compound with an ethylenic unsaturated bond as component (B) preferably contains a compound with 4-40 C2-6 oxyalkylene units (alkylene glycol units) in the molecule. By including such a compound as component (B), it is possible to improve the compatibility with the (A) binder polymer.

As C2-6 oxyalkylene units there may be mentioned oxyethylene unit, oxypropylene unit, oxyisopropylene unit, oxybutylene unit, oxypentylene unit and oxyhexylene unit. Among them, preferred oxyalkylene units are oxyethylene unit and oxyisopropylene unit, from the viewpoint of improved resolution and plating resistance.

Of these photopolymerizing compounds, bisphenol A-based (meth)acrylate compounds and polyalkyleneglycol di(meth)acrylates are especially preferred since they will tend to more reliably produce the effect of the invention.

Preferred bisphenol A-based (meth)acrylate compounds are compounds represented by the following general formula (I).

[Chemical Formula 1]

In general formula (I), $R^1$ and $R^2$ each independently represent hydrogen or a methyl group, and preferably a methyl group. In general formula (I) above, $X^1$ and $X^2$ each independently represent a C2-6 alkylene group, and are preferably ethylene or propylene groups and more preferably ethylene groups. The letters p and q in general formula (I) are positive integers selected so that p+q=4-40. The value of p+q is preferably 6-34, more preferably 8-30, even more preferably 8-28, especially preferably 8-20, even yet more preferably 8-16 and most preferably 8-12. If the value of p+q is less than 4, compatibility with the binder polymer used as component (A) will be reduced, and peeling will tend to occur when the photosensitive element has been laminated on a circuit-forming board. If the value of p+q exceeds 40, the hydrophilicity will increase and the resist image will more easily peel off during development, while the plating resistance for solder plating and the like will tend to be reduced. The resolution of the photosensitive element will also tend to be lower if the value is too high or too low.

As examples of C2-6 alkylene groups there may be mentioned ethylene, propylene, isopropylene, butylene, pentylene and hexylene. Ethylene or isopropylene groups are preferred from the viewpoint of improving the resolution and plating resistance.

The aromatic ring in general formula (I) may be optionally substituted. As examples of substituents there may be mentioned halogen atoms, C1-20 alkyl, C3-10 cycloalkyl, C6-18 aryl, phenacyl, amino, C1-10 alkylamino, C2-20 dialkylamino, nitro, cyano, carbonyl, mercapto, C1-10 alkylmercapto, allyl, hydroxyl, C1-20 hydroxyalkyl, carboxyl, carboxyalkyl with 1-10 carbon atoms in the alkyl group, acyl with 1-10 carbon atoms in the alkyl group, C1-20 alkoxy, C1-20 alkoxycarbonyl, C2-10 alkylcarbonyl, C2-10 alkenyl, C2-10 N-alkylcarbamoyl and heterocyclic ring-containing groups, as well as aryl groups substituted with these substituents. The substituents mentioned above may form fused rings, or the hydrogen atoms in the substituents may be replaced by the aforementioned substituents, such as halogen atoms. If the number of substituents is two or more, the two or more substituents may be the same or different.

As examples of compounds represented by general formula (I) above there may be mentioned bisphenol A-based (meth)acrylate compounds such as 2,2-bis(4-((meth)acryloxypolyethoxy)phenyl)propanes, 2,2-bis(4-((meth)acryloxypolypropoxy)phenyl)propanes, 2,2-bis(4-((meth)acryloxypolybutoxy)phenyl)propanes and 2,2-bis(4-((meth)acryloxypolyethoxypolypropoxy)phenyl)propanes.

As examples of 2,2-bis(4-((meth)acryloxypolyethoxy)phenyl)propanes there may be mentioned 2,2-bis(4-((meth)acryloxydiethoxy)phenyl)propane, 2,2-bis(4-((meth)acryloxytriethoxy)phenyl)propane, 2,2-bis(4-((meth)acryloxytetraethoxy)phenyl)propane, 2,2-bis(4-((meth)acryloxypentaethoxy)phenyl)propane, 2,2-bis(4-((meth)acryloxyhexaethoxy)phenyl)propane, 2,2-bis(4-((meth)acryloxyheptaethoxy)phenyl)propane, 2,2-bis(4-((meth)acryloxyoctaethoxy)phenyl)propane, 2,2-bis(4-((meth)acryloxynonaethoxy)phenyl)propane, 2,2-bis(4-((meth)acryloxydecaethoxy)phenyl)propane, 2,2-bis(4-((meth)acryloxyundecaethoxy)phenyl)propane, 2,2-bis(4-((meth)acryloxydodecaethoxy)phenyl)propane, 2,2-bis(4-((meth)acryloxytridecaethoxy)phenyl)propane, 2,2-bis(4-((meth)acryloxytetradecaethoxy)phenyl)propane, 2,2-bis(4-((meth)acryloxypentadecaethoxy)phenyl)propane and 2,2-bis(4-((meth)acryloxyhexadecaethoxy)phenyl)propane. Of these, 2,2-bis(4-(methacryloxypentaethoxy)phenyl)propane is commercially available as BPE-500 (trade name of Shin-Nakamura Chemical Co., Ltd.). Also, 2,2-bis(4-(methacryloxypentadecaethoxy)phenyl)propane is commercially available as BPE-1300 (trade name of Shin-Nakamura Chemical Co., Ltd.). These may be used as single compounds or as combinations of two or more compounds.

As examples of 2,2-bis(4-((meth)acryloxypolyethoxypolypropoxy)phenyl)propanes there may be mentioned 2,2-bis(4-((meth)acryloxydiethoxyoctapropoxy)phenyl)propane, 2,2-bis(4-((meth)acryloxytetraethoxytetrapropoxy)phenyl)propane and 2,2-bis(4-((meth)acryloxyhexaethoxyhexapropoxy)phenyl)propane. Any of these may be used alone or in combinations of two or more.

As preferred examples of polyalkyleneglycol di(meth)acrylate there may be mentioned compounds represented by the following general formula (II).

[Chemical Formula 2]

In general formula (II), $R^3$ and $R^4$ each independently represent hydrogen or a C1-3 alkyl group, and preferably a methyl group. In general formula (II) above, $Y^1$, $Y^2$ and $Y^3$ each independently represent a C2-6 alkylene group, and are preferably ethylene or propylene. The letters s, t and u in general formula (II) are integers of 0-30 selected so that s+t+u=4-40. The value of s+t+u is preferably 5-30, more preferably 8-23 and most preferably 10-15. If the value of s+t+u is less than 4, the boiling point of the compound will be lower and the odor of the photosensitive layer 20 will tend to be stronger. If the value of s+t+u is greater than 40, the concentration of photoreactive sites per unit weight will be lower, tending to prevent a practical level of sensitivity.

When the oxyalkylene units ($-(Y^1-O)_s-$, $-(Y^2-O)_t-$ and $-(Y^3-O)_u-$) in general formula (II) above contain, for example, multiple oxyethylene and oxypropylene units, the multiple oxyethylene and oxypropylene units do not need to be present in continuous blocks and may instead be randomly arranged.

Also, when the oxyalkylene unit is oxyisopropylene, the secondary carbon of the propylene group may be bonded to an oxygen atom and the primary carbon may be bonded to an oxygen atom.

As preferred examples of compounds represented by general formula (II) above there may be mentioned compounds represented by the following general formulas (III), (IV) and (V). Any of these may be used alone or in combinations of two or more.

[Chemical Formula 3]

(III)

In formula (III), $R^3$ and $R^4$ each independently represent hydrogen or a C1-3 alkyl group, EO represents an oxyethylene unit, PO represents an oxypropylene unit, and $m^1$, $m^2$ and $n^1$ represent integers of 1-30 selected so that $m^1+m^2+n^1=4-40$.

[Chemical Formula 4]

(IV)

In formula (IV), $R^3$ and $R^4$ each independently represent hydrogen or a C1-3 alkyl group, EO represents an oxyethylene unit, PO represents an oxypropylene unit, and $m^3$, $n^2$ and $n^3$ represent integers of 1-30 selected so that $m^3+n^2+n^3=4-40$.

[Chemical Formula 5]

(V)

In formula (V), $R^3$ and $R^4$ each independently represent hydrogen or a C1-3 alkyl group, EO represents an oxyethylene unit, PO represents an oxypropylene unit, and $m^4$ and $n^4$ represent integers of 1-30 selected so that $m^4+n^4=4-40$.

As examples for the C1-3 alkyl groups in general formulas (III), (IV) and (V) there may be mentioned methyl, ethyl, n-propyl and isopropyl.

The total number of repeating oxyethylene units in general formulas (III), (IV) and (V) ($m^1+m^2$, $m^3$ and $m^4$) is each independently preferably an integer of 1-30, more preferably an integer of 1-10, even more preferably an integer of 4-9 and most preferably an integer of 5-8. If the number of repeats exceeds 30, the tent reliability and resist shape will tend to be poor.

The total number of repeating oxypropylene units in general formulas (III), (IV) and (V) ($n^1$, $n^2+n^3$ and $n^4$) is each independently preferably an integer of 1-30, more preferably an integer of 5-20, even more preferably an integer of 8-16 and most preferably an integer of 10-14. If the number of repeats exceeds 30, the resolution will be poor and sludge will tend to be produced.

As a specific example of a compound represented by general formula (III) above there may be mentioned a vinyl compound wherein $R^3$ and $R^4$ are methyl, $m^1+m^2=4$ (mean value) and $n^1=12$ (mean value) (trade name: FA-023M by Hitachi Chemical Co., Ltd.).

As a specific example of a compound represented by general formula (IV) above there may be mentioned a vinyl compound wherein $R^3$ and $R^4$ are methyl, $m^3=6$ (mean value) and $n^2+n^3=12$ (mean value) (trade name: FA-024M by Hitachi Chemical Co., Ltd.).

As a specific example of a compound represented by general formula (V) above there may be mentioned a vinyl compound wherein $R^3$ and $R^4$ are hydrogen, $m^4=1$ (mean value) and $n^4=9$ (mean value) (sample name: NK Ester HEMA-9P by Shin-Nakamura Chemical Co., Ltd.).

These may also be used as single compounds or as combinations of two or more compounds.

Component (B) may also contain another photopolymerizing compound with an ethylenic unsaturated bond in addition to the photopolymerizing compound with a polymerizable ethylenic unsaturated bond in the molecule, as described above. As examples of other photopolymerizing compounds with one ethylenic unsaturated bond there may be mentioned nonylphenoxypolyalkyleneoxy (meth)acrylates such as nonylphenoxypolyethyleneoxy (meth)acrylate, nonylphenoxypolypropyleneoxy (meth)acrylate and nonylphenoxypolyethyleneoxypolypropyleneoxy (meth)acrylate, phthalic acid-based compounds such as γ-chloro-β-hydroxypropyl-β'-(meth)acryloyloxyethyl-o-phthalate and β-hydroxyalkyl-β'-(meth)acryloyloxyalkyl-o-phthalate, and alkyl (meth)acrylate esters. The properties, including the developing solution property and release property, can be improved by adding a photopolymerizing compound with one ethylenic unsaturated bond.

The photosensitive resin composition of the invention may also contain photopolymerizing compounds other than the photopolymerizing compounds mentioned above. As examples of such photopolymerizing compounds there may be mentioned compounds obtained by reacting α,β-unsaturated carboxylic acids with glycidyl group-containing compounds, and urethane monomers such as (meth)acrylate compounds with urethane bonds.

As examples of photopolymerization initiators as component (C) there may be mentioned benzophenones; N,N-tetraalkyl-4,4'-diaminobenzophenones such as N,N-tetramethyl-4,4'-diaminobenzophenone (Michler's ketone); aromatic ketones such as 2-benzyl-2-dimethylamino-1-(4-morpholinophenyl)-butanone-1, 2-methyl-1-[4-(methylthio)phenyl]-2-morpholino-propanone-1; quinone compounds such as alkylanthraquinones; benzoinether compounds such as benzoinalkyl ethers; benzoin compounds such as benzoin and alkylbenzoins; benzyl derivatives such as benzyldimethylketal; 2,4,5-triarylimidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer and 2-(p-methoxyphenyl)-4,5-diphenylimidazole dimer; acridine derivatives such as 9-phenylacridine and 1,7-bis(9,9'-acridinyl)heptane; N-phenylglycine, N-phenylglycine derivatives and coumarin-based compounds. Two of the aryl substituents of 2,4,5-triarylimidazole in a 2,4,5-triarylimidazole dimer may be identical to constitute a symmetrical compound, or they may be different to constitute an asymmetrical compound. From the viewpoint of improving adhesiveness and sensitivity, a 2,4,5-triarylimidazole dimer is preferred. These may be used alone or in combinations of two or more.

The content of the binder polymer as component (A) is preferably 40-70 parts by weight and more preferably 50-60 parts by weight with respect to 100 parts by weight as the total of component (A) and component (B). If the content is less than 40 parts by weight the photocured product will tend to be fragile, and if it is greater than 70 parts by weight the resolution and photosensitivity will tend to be insufficient.

The content of the photopolymerizing compound with an ethylenic unsaturated bond as component (B) is preferably 30-60 parts by weight and more preferably 40-50 parts by weight with respect to 100 parts by weight as the total of component (A) and component (B). If the content is less than 30 parts by weight the resolution and photosensitivity will tend to be insufficient, and if it is greater than 60 parts by weight the photocured product will tend to be fragile.

The content of the photopolymerization initiator as component (C) is preferably 0.1-20 parts by weight, more preferably 0.2-10 parts by weight and even more preferably 0.5-5 parts by weight with respect to 100 parts by weight as the total of component (A) and component (B). If the content is less than 0.1 part by weight the photosensitivity will tend to be insufficient, and if it is greater than 20 parts by weight the photoabsorption on the surface of the photosensitive resin composition during exposure will increase, tending to result in insufficient photocuring of the interior.

The photosensitive resin composition may also contain, if necessary, additives such as photopolymerizing compounds with at least one cationic polymerizable cyclic ether group in the molecule (oxetane compounds, etc.), cationic polymerization initiators, dyes such as malachite green, photochromic agents such as tribromophenylsulfone and leuco crystal violet, thermal development inhibitors, plasticizers such as p-toluenesulfonamide, pigments, fillers, antifoaming agents, flame retardants, stabilizers, tackifiers, leveling agents, release promoters, antioxidants, aromas, imaging agents and thermal crosslinking agents. Any of these may be used alone or in combinations of two or more. These additives may be included at about 0.01-20 parts by weight each with respect to 100 parts by weight as the total of component (A) and component (B), so long as the object of the invention is not hindered.

The photosensitive resin composition may, if necessary, be prepared as a solution in a solvent such as methanol, ethanol, acetone, methyl ethyl ketone, methylcellosolve, ethylcellosolve, toluene, N,N-dimethylformamide or propyleneglycol monomethyl ether, or a mixture of such solvents, at a solid content of about 30-60 wt %.

The photosensitive layer 20 of the photosensitive element 1 of the invention may be formed by coating the photosensitive resin composition onto the support film 10 and removing the solvent. Examples of coating methods that may be employed include known methods such as roll coating, comma coating, gravure coating, air knife coating, die coating, bar coating and the like. The solvent removal can be carried out, for example, at 70-150° C. for about 5-30 minutes. The amount of residual organic solvent in the photosensitive layer 20 is preferably no greater than 2 wt % from the viewpoint of preventing diffusion of the organic solvent in subsequent steps.

The thickness of the photosensitive layer 20 formed in this manner is 3-30 μm and preferably 5-25 μm, as the post-drying thickness. When the photosensitive element of the invention is to be used for etching, the thickness is preferably 8-18 μm and most preferably 10-15 μm. A thickness of less than 3 μm may result in more inconveniences when the photosensitive layer is laminated on the circuit-forming board, with an inferior tenting property, damage to the resist during the development and etching steps, and potentially causing open failures, thus tending to lower production yield of the printed wiring board. On the other hand, a thickness of greater than 30 μm will lower the resolution of the photosensitive layer 20 and impair the liquid edges of the etching solution, thereby increasing the effects of side etching and hampering production of high-density printed wiring boards. When the photosensitive element of the invention is to be used for plating, the thickness is preferably 15-25 μm and most preferably 20-25 μm. A thickness of less than 3 μm may result in more inconveniences when the photosensitive layer is laminated on the circuit-forming board, as well as overhang of the plating solution, thus potentially preventing full release of the photosensitive layer when it is attempted to release the photosensitive layer after plating, and tending to lower production yield of the printed wiring board. If the thickness is greater than 30 μm, on the other hand, the resolution of the photosensitive layer 20 will tend to be lower, making it difficult to produce a high-density printed wiring board.

The photosensitive element 1 may comprise a protective film (not shown) on the second main side 14 opposite the first main side 12 of the photosensitive layer 20 that is in contact with the support film 10. The protective film is preferably a film such that the adhesive force between the photosensitive layer 20 and protective film is lower than the adhesive force between the photosensitive layer 20 and the support film 10, and preferably a low fisheye film is used. As examples of protective films there may be mentioned, specifically, inactive polyolefin films such as polyethylene and polypropylene. From the viewpoint of releasability from the photosensitive layer 20, a polyethylene film is preferred. The thickness of the protective film is preferably about 1-100 μm, although this will differ depending on the purpose of use.

The photosensitive element 1 may also comprise interlayers or protective layers such as a cushion layer, adhesive layer, photoabsorbing layer or gas barrier layer in addition to the support film 10, the photosensitive layer 20 and the protective film.

The photosensitive element 1 of this embodiment may be stored in a condition where it is rolled around a cylindrical winding core, either alone or having a protective film further laminated on the photosensitive layer 20. In this case, it is preferably wound into a roll in such a manner that the support film 10 is the outermost layer. From the viewpoint of edge protection, an edge separator is preferably situated at the edge of the photosensitive element 1 that has been wound into a roll, while from the viewpoint of preventing edge fusion, the edge separator is preferably moisture-proof. The packaging method is preferably one that involves bundling in a black sheet with low moisture permeability.

The material of the winding core may be a plastic such as polyethylene resin, polypropylene resin, polystyrene resin, polyvinyl chloride resin or ABS resin (acrylonitrile-butadiene-styrene copolymer).

(Resist Pattern Forming Method)

The resist pattern forming method of this embodiment is a method comprising a lamination step in which the photosensitive element 1 is laminated on a circuit-forming board beginning with the photosensitive layer 20 and then the support film 10, an exposure step in which prescribed sections of the photosensitive layer 20 are irradiated with active light rays through the support film 10 to form photocured sections on the photosensitive layer 20, and a developing step in which the non-photocured sections of the photosensitive layer 20 are removed.

The method of laminating the photosensitive layer 20 on the circuit-forming board in the lamination step may be, for example, a laminating method in which the protective film is removed, if a protective film is present on the photosensitive layer 20, and then the photosensitive layer 20 is contact bonded to the circuit-forming board at a pressure of about 0.1-1 MPa while heating to about 70-130° C. The lamination in this lamination step may also be carried out under reduced pressure. The laminating surface of the circuit-forming board will usually be a metal surface, but this is not restrictive. For further improved laminating properties, the circuit-forming board may be subjected to preheating treatment.

Next, a photomask with a negative or positive mask pattern is bonded onto the photosensitive layer 20 that has been laminated in the lamination step, being positioned on the second main side 14 of the support film 10. In the subsequent exposure step, the photosensitive layer 20 is irradiated with active light rays through the support film 10 in the form of an image, to form photocured sections on the photosensitive layer 20. The light source for the active light rays may be a publicly known light source that efficiently emits ultraviolet rays or visible light, such as, for example, a carbon arc lamp, mercury vapor arc lamp, high-pressure mercury lamp or xenon lamp. A laser direct writing exposure method may also be employed.

After the exposure step, the photomask is released from the support film 10. The support film 10 is also released and removed from the photosensitive layer 20. In the subsequent developing step, development may be accomplished by removing the unexposed sections (non-photocured sections) of the photosensitive layer 20 by wet development using a developing solution such as an aqueous alkali solution, aqueous developing solution or organic solvent, or dry development, to produce a resist pattern.

As examples of aqueous alkali solutions there may be mentioned a 0.1-5 wt % sodium carbonate dilute solution, a 0.1-5 wt % potassium carbonate dilute solution or a 0.1-5 wt % sodium hydroxide dilute solution. The pH of the aqueous alkali solution is preferably in the range of 9-11, and the temperature is adjusted as appropriate for the developing property of the photosensitive layer 20. The aqueous alkali solution may also contain added surfactants, antifoaming agents or organic solvents. The developing system may be, for example, a dip system, a spray system, brushing or slapping.

Treatment following the developing step may consist of heating at about 60-250° C. or exposure at about 0.2-10 J/cm$^2$ if necessary for further curing of the resist pattern.

The method described above can be used to form a resist pattern on the conductive layer onto which the circuit pattern has been formed. The resist pattern may be used as a solder resist to prevent unwanted adhesion of solder onto sections of the conductive layer during bonding of mounted parts.

The resist pattern obtained by the formation method described above, can be used to form cured resins with excellent physical properties including tensile strength and elongation percentage on rigid boards, while also exhibiting satisfactory electrolytic corrosion resistance, and more preferably it is used as a permanent mask (solder resist) for formation on rigid boards. Specifically, it is useful when used as the solder resist of a printed wiring board comprising a rigid board or the solder resist of a package board comprising a rigid board.

(Printed Wiring Board Production Process).

The process for production of a printed wiring board according to this embodiment may be carried out by etching or plating the circuit-forming board having the resist pattern formed by the resist pattern forming method described above. The etching or plating of the circuit-forming board is accomplished by etching or plating the surface of the circuit-forming board by a known process using the developed resist pattern as a mask.

The etching solution used for etching may be, for example, a cupric chloride solution, ferric chloride solution or alkali etching solution.

As examples of methods for plating there may be mentioned copper plating, solder plating, nickel plating and gold plating.

After the etching or plating, the resist pattern may be released, for example, with an aqueous solution of stronger alkalinity than the aqueous alkali solution used for development. The strongly alkaline aqueous solution used here may be, for example, a 1-10 wt % sodium hydroxide aqueous solution or a 1-10 wt % potassium hydroxide aqueous solution. The releasing system may be, for example, a dipping system or spray system. The printed wiring board on which the resist pattern has been formed may be a multilayer printed wiring board, and it may also have small through-holes.

When the plating is carried out for a circuit-forming board provided with an insulating layer and a conductive layer formed on the insulating layer, the sections of the conductive layer other than the pattern must be removed. As examples of removal methods there may be mentioned a method of releasing the resist pattern and then lightly etching, and a method of performing solder plating or the like after plating and then removing the resist pattern to leave a solder mask on the wiring sections, and finally carrying out treatment using an etching solution capable of etching only the conductive layer.

(Semiconductor Package Board Production Process)

The photosensitive element 1 of the invention may be used in a package board comprising a rigid board and an insulating film formed on the rigid board. In this case, the photocured section of the photosensitive layer may be used as the insulating film. When the photocured section of the photosensitive layer is to be used as the solder resist for a semiconductor package, for example, it is preferably exposed to ultraviolet irradiation with a high-pressure mercury lamp or to heating, upon completion of the development in the resist pattern forming method described above, in order to improve the soldering heat resistance and chemical resistance. In the case of ultraviolet irradiation, the exposure dose may be adjusted if necessary for irradiation with an exposure dose of, for example, about 0.2-10 J/cm$^2$. In the case of heating of the resist pattern, it is preferably carried out in a range of about 100-170° C. for about 15-90 minutes. Ultraviolet irradiation and heating may also be carried out simultaneously, or either one may be carried out before or after the other. When ultraviolet ray exposure and heating are carried out simultaneously, the heating is preferably at 60-150° C. from the viewpoint of more effectively imparting soldering heat resistance and chemical resistance.

The solder resist also serves as a protecting film for wiring after soldering onto the board, and exhibits excellent physical properties including tensile strength and elongation percentage as well as thermal shock resistance, and it is therefore effective as a permanent mask for a semiconductor package.

A package board comprising such a resist pattern is later mounted on a semiconductor element or the like (for example, by wire bonding or soldering connection), and is installed in an electronic device such as a personal computer.

For the photosensitive element, resist pattern forming method, printed wiring board and semiconductor package board production process according to the embodiment described above, the support film 10 in the photosensitive element 1 is a support film having no more than 5/mm$^2$ particles with diameters of 5 μm or larger in the support film. Thus, when the photosensitive layer 20 is exposed to active light rays through the support film 10, light scattering in the support film 10 is kept to a minimum so that the formed photocured sections have satisfactorily reduced resist microdefects in the photosensitive layer 20. Consequently, since both the obtained resist pattern and the circuit pattern in the printed wiring board have satisfactorily reduced pattern microdefects, production yield of the printed wiring board can be improved.

The invention was explained above in detail based on embodiments thereof. However, the invention is not limited to these described embodiments. The invention may also be applied in a variety of modifications so long as the gist thereof is maintained.

EXAMPLES

The present invention will now be explained in detail by examples, with the understanding that the invention is not limited to the examples.

Examples 1-5 and Comparative Examples 1-7

The components listed in Table 1 below were combined to prepare photosensitive resin composition solutions.

The weight-average molecular weight of the binder polymer as component (A) was measured by GPC, with calculation based on a standard polystyrene calibration curve. The GPC conditions were as follows.
Pump: Hitachi L-6000 (Hitachi, Ltd.).
Column: Gelpack GL-R440+Gelpack GL-R450+Gelpack GL-R440M (total: 3) (all trade names of Hitachi Chemical Co., Ltd.)
Eluent: tetrahydrofuran
Measuring temperature: 40° C.
Flow rate: 2.05 mL/min
Detector: Hitachi L-3300 RI (Hitachi, Ltd.).

(Fabrication of Photosensitive Elements

The PET films listed in Tables 2 and 3 were used as the photosensitive element support films. The results for the number of particles of 5 μm or larger in each PET film, and the haze values, are shown in Tables 2 and 3.

The number of such particles is the value measured using a polarizing microscope, as the number of particles of 5 μm or larger present per 1 $mm^2$ unit. The value of n was 5. The haze value is the value measured according to HS K 7105. The thicknesses of the support films were all 16 μm.

The aforementioned photosensitive resin composition solution was coated to an even thickness onto each PET film, and dried for 2 minutes with a hot air convection current drier at 100° C. to remove the solvent. After drying, the photosensitive layer was covered with a polyethylene film (trade name: "NF-15" by Tamapoly Co., Ltd., thickness: 20 μm) as a protective film to obtain a photosensitive element. The thickness of the dried photosensitive layer was adjusted as listed under "Photosensitive layer film thickness" in Table 2 and Table 3.

(Fabrication of Laminated Body)

The copper surface of a copper clad laminate ("MLC-E-679", trade name of Hitachi Chemical Co., Ltd.) comprising a glass epoxy material laminated on both sides of a copper foil (thickness: 35 μm) was polished using a polishing machine with a #600-equivalent brush (Sankei Co., Ltd.), and after cleaning with water, it was dried with an air stream. The obtained copper clad laminate was heated to 80° C., and the photosensitive element was laminated while peeling off the protective film, in such a manner that the photosensitive layer was in contact with the copper surface. Laminated bodies were thus obtained each comprising a copper clad laminate, photosensitive layer and support film laminated in that order. The lamination was carried out using a heat roll at 120° C., with a contact bonding pressure of 0.4 MPa and a roll speed of 1.5 m/min. The laminated bodies were used as test pieces for the following tests.

TABLE 1

|  |  |  | Content (g) |
|---|---|---|---|
| Component (A) | A-1 | 60 wt % Toluene/methyl cellosolve (weight ratio: 6/4) solution containing methacrylic acid/methyl methacrylate/styrene copolymer (weight ratio: 25/30/25, weight-average molecular weight: 50000, acid value: 163 mgKOH/g) | 150 (Solid content: 60 g) |
|  | A-2 | 60 wt % Toluene/methyl cellosolve (weight ratio: 6/4) solution containing methacrylic acid/methyl methacrylate/styrene copolymer (weight ratio: 25/30/25, weight-average molecular weight: 90000, acid value: 163 mgKOH/g) |  |
|  | A-3 | 60 wt % Toluene/methyl cellosolve (weight ratio: 6/4) solution containing methacrylic acid/methyl methacrylate/styrene copolymer (weight ratio: 25/30/25, weight-average molecular weight: 150000, acid value: 163 mgKOH/g) |  |
| Component (B) |  | 2,2-bis(4-(Methacryloxypentadecaethoxy)phenylpropane | 30 |
|  |  | Nonylphenoxypolyethyleneoxyacrylate (repeating oxyethylene units: 8) | 10 |
| Component (C) |  | N,N'-Tetraethyl-4,4'-diaminobenzophenone | 0.15 |
|  |  | 2-(o-Chlorophenyl)-4,5-diphenylimidazole dimer | 3 |
| Other components |  | Leuco crystal violet | 0.5 |
|  |  | Malachite green | 0.05 |
|  |  | p-Toluenesulfonic acid amide | 4 |
| Solvent |  | Acetone | 10 |
|  |  | Toluene | 10 |
|  |  | Methanol | 3 |
|  |  | N,N-dimethylformamide | 3 |

(Photosensitivity Measurement Test)

A Stouffer 21-step tablet was placed as a negative on the support film of the test piece, and an exposure apparatus with a high-pressure mercury lamp (trade name: "EXM-1201" by ORC Manufacturing Co., Ltd.) was used for exposure of the photosensitive layer at an energy dose of 60 mJ/cm². The support film was released, and 1 wt % aqueous sodium carbonate at 30° C. was sprayed for twice the minimum developing time to remove the unexposed sections, for development. The number of steps of the step tablet of the photocured film formed on the copper clad laminate was then counted to evaluate the photosensitivity of the photosensitive resin composition. The photosensitivity is indicated by the number of steps of the step tablet, with a higher step tablet step number representing higher photosensitivity. The results are shown in Tables 2 and 3.

(Resolution Measurement Test)

In order to investigate the resolution, a phototool with a Stouffer 21-step tablet and a glass chromium-type phototool having a wiring pattern with a line width/space width of 2/2-30/30 (units: μm) as a negative for evaluation of resolution were adhered to the support film of the test piece, and an exposure apparatus equipped with a high-pressure mercury lamp (trade name: "EXM-1201" by ORC Manufacturing Co., Ltd.) was used to provide an irradiated energy dose for a residual step number of 8.0 after development of the Stouffer 21-step tablet. The support film was released, and 1 wt % aqueous sodium carbonate at 30° C. was sprayed for 4 times the minimum developing time to remove the unexposed sections, for development. The resolution was evaluated based on the smallest value for the space width between line widths that allowed clean removal of the unexposed sections by developing treatment (units: μm). Small values are more satisfactory in evaluating the resolution. The results are shown in Tables 2 and 3.

(Evaluation of Resist Line Edge Form)

The resist line edge form of a board evaluated by the resolution measurement test described above was observed using a scanning electron microscope (trade name: S-2100A by Hitachi, Ltd.), and evaluated in the following manner. The results are shown in Tables 2 and 3.

A: Smooth form
B: Slightly rough form
C: Rough form (Adhesiveness Measurement Test)

In order to investigate the adhesiveness, a phototool with a Stouffer 21-step tablet and a glass chromium-type phototool having a wiring pattern with a line width/space width of 2/1000-30/1000 (units: μm) as a negative for evaluation of adhesiveness were adhered to the support film of the test piece, and an exposure apparatus equipped with a high-pressure mercury lamp (trade name: "EXM-1201" by ORC Manufacturing Co., Ltd.) was used to provide an irradiated energy dose for a residual step number of 8.0 after development of the Stouffer 21-step tablet. The support film was released, and 1 wt % aqueous sodium carbonate at 30° C. was sprayed for 4 times the minimum developing time to remove the unexposed sections, for development. The resolution was evaluated based on the smallest value for the line width that allowed clean removal of the unexposed sections by developing treatment (units: μm). Small values are desirable for the adhesiveness evaluation. The results are shown in Tables 2 and 3.

(Tenting Property Measurement Test)

In order to examine the tenting property, a laminated body was fabricated in the same manner as described above except for using a copper-clad laminate with a through-holes. The board used had a through-hole diameter of 3.0 mm and a total of 200 holes. In order to investigate the tenting property, a phototool with a Stouffer 21-step tablet was adhered to the support film of the test piece, and an exposure apparatus equipped with a high-pressure mercury lamp (trade name: "EXM-1201" by ORC Manufacturing Co., Ltd.) was used to provide an irradiated energy dose for a residual step number of 8.0 after development of the Stouffer 21-step tablet. The total area was exposed, without using a phototool at the through-hole sections. The support film was released, and 1 wt % aqueous sodium carbonate at 30° C. was sprayed for 8 times the minimum developing time to remove the unexposed sections, for development. The number of locations where the resist had torn at the through-hole sections was confirmed, and the tent tear rate (%) was calculated. A smaller tent tear rate is more satisfactory. The results are shown in Tables 2 and 3.

(Resist Microdefect Formation Measurement Test)

In order to investigate the resist microdefect formation, a phototool with a Stouffer 21-step tablet and a glass chromium-type phototool having a wiring pattern with a line width/space width of 10/30 (units: μm) as a negative for evaluation of adhesiveness were adhered to the support film of the test piece, and an exposure apparatus equipped with a high-pressure mercury lamp was used to provide an irradiated energy dose for a residual step number of 5.0 after development of the Stouffer 21-step tablet. The support film was released, and 1 wt % aqueous sodium carbonate at 30° C. was sprayed for twice the minimum developing time to remove the unexposed sections, for development. A microscope was then used to count the number of resist defects. Using 10 lines with a line length of 1 mm as the observational unit, the mean value for n=5 was determined as the number of resist microdefects formed. The results are shown in Tables 2 and 3.

TABLE 2

|  |  | Example 1 | Example 2 | Example 3 | Example 4 | Example 5 |
|---|---|---|---|---|---|---|
| Support film | Product name | QS-48*1 | QS-48 | QS-48 | QS-48 | QS-48 |
|  | Film thickness (μm) | 16 | 16 | 16 | 16 | 16 |
|  | Particles | 1 | 1 | 1 | 1 | 1 |
|  | Haze | 0.4 | 0.4 | 0.4 | 0.4 | 0.4 |
| Component (A) |  | A-1 | A-2 | A-2 | A-1 | A-3 |
| Photosensitive layer film thickness (μm) |  | 15 | 10 | 25 | 10 | 10 |
| Minimum developing time (sec) |  | 9 | 7 | 15 | 5 | 9 |
| Photosensitivity (step) |  | 7.0 | 8.0 | 7.5 | 7.5 | 8.5 |
| Adhesiveness (μm) |  | 10 | 10 | 12 | 8 | 9 |
| Resolution (μm) |  | 8 | 8 | 12 | 6 | 15 |
| Tent tear rate (%) |  | 10 | 0 | 0 | 45 | 0 |
| Resist edge form |  | A | A | A | A | A |
| Number of resist microdefects |  | 0 | 0 | 0 | 0 | 0 |

TABLE 3

|  |  | Comp. Ex. 1 | Comp. Ex. 2 | Comp. Ex. 3 | Comp. Ex. 4 | Comp. Ex. 5 | Comp. Ex. 6 | Comp. Ex. 7 |
|---|---|---|---|---|---|---|---|---|
| Support film | Product name | HTF-01*² | HTR-02*³ | A-1517*⁴ | R-340G*⁵ | A2100-16*⁶ | HTF-01 | HTR-02 |
|  | Film thickness ($\mu$m) | 16 | 16 | 16 | 16 | 16 | 16 | 16 |
|  | Particles | 28 | 318 | 105 | 41 | 110 | 28 | 318 |
|  | Haze | 0.2 | 2.0 | 0.2 | 0.5 | 0.2 | 0.2 | 2.0 |
| Component (A) | | A-1 | A-1 | A-1 | A-1 | A-1 | A-2 | A-2 |
| Photosensitive layer film thickness ($\mu$m) | | 15 | 15 | 15 | 15 | 15 | 10 | 10 |
| Minimum developing time (sec) | | 9 | 9 | 9 | 9 | 9 | 7 | 7 |
| Photosensitivity (step) | | 7.0 | 7.0 | 7.0 | 7.0 | 7.0 | 8.0 | 8.0 |
| Adhesiveness ($\mu$m) | | 10 | 10 | 10 | 10 | 10 | 10 | 10 |
| Resolution ($\mu$m) | | 8 | 8 | 8 | 8 | 8 | 8 | 9 |
| Tent tear rate (%) | | 10 | 10 | 10 | 10 | 10 | 0 | 0 |
| Resist edge form | | B | C | B | B | B | B | C |
| Number of resist microdefects | | 7 | 172 | 4 | 15 | 5 | 5 | 151 |

*¹Three-layer structure biaxially oriented PET film with fine particle-containing layer on front and back (product of Toray Co., Ltd.).
*²Two-layer structure biaxially oriented PET film having different fine particle contents on front and back (product of Teijin-DuPont Films).
*³Three-layer structure biaxially oriented PET film with fine particle-containing layer on front and back (product of Teijin-DuPont Films).
*⁴Two-layer structure biaxially oriented PET film with fine particle-containing layer on one side (product of Toyobo, Ltd.).
*⁵Biaxially oriented PET film containing fine particles (unknown layer structure) (product of Mitsubishi Chemical Polyester Films).
*⁶Two-layer structure biaxially oriented PET film with fine particle-containing layer on one side (product of Toyobo, Ltd.).

As shown in Tables 2 and 3, the haze values of the PET films used in Examples 1-5 and Comparative Examples 1-7 were roughly equal, but the number of particles of 5 $\mu$m or larger per 1 mm² unit of the PET films used in Examples 1-5 was 1, which was much lower compared to the PET films used in Comparative Examples 1-7. Based on the results of measurement of the resist microdefect formation, therefore, Examples 1-5 had 0 resist defects, which was much lower than Comparative Examples 1-7. Furthermore, the resist edge form after development was smooth in Examples 1-5 and formation of a satisfactory resist pattern was confirmed.

INDUSTRIAL APPLICABILITY

According to the invention it is possible to provide a photosensitive element comprising a thin-film layer composed of a photosensitive resin composition, whereby it is possible to form resist patterns with satisfactorily reduced microdefects in the resist.

The invention claimed is:

1. A photosensitive element comprising a support film and a layer comprising a photosensitive resin composition formed on the support film, wherein the haze of the support film is 0.01-2.0%, and the total number of particles with diameters of 5 $\mu$m or larger and aggregates with diameters of 5 $\mu$m or larger in the support film is no greater than 5/mm² measured using a polarizing microscope at a magnification sufficient to detect those particles and aggregates having diameters of 5 $\mu$m or larger, wherein the layer comprising the photosensitive resin composition includes (A) a binder polymer;

(B) a photopolymerizing compound with an ethylenic unsaturated bond; and (C) a photopolymerization initiator, and wherein a thickness of the layer comprising the photosensitive resin composition is 3-30 $\mu$m.

2. A photosensitive element according to claim 1, wherein the weight-average molecular weight of the (A) binder polymer is 30000-150000.

* * * * *